US011682870B2

(12) United States Patent
Song et al.

(10) Patent No.: US 11,682,870 B2
(45) Date of Patent: Jun. 20, 2023

(54) HOUSING-INTEGRATED BOARD MATING CONNECTOR AND METHOD OF MANUFACTURING SAME

(71) Applicant: GigaLane Co., Ltd., Hwaseong-si (KR)

(72) Inventors: Hwa Yoon Song, Hwaseong-si (KR); Sang Min Seo, Hwaseong-si (KR); Eun Jung Kim, Hwaseong-si (KR); Jin Uk Lee, Hwaseong-si (KR); Kyung Hun Jung, Hwaseong-si (KR); Hee seok Jung, Hwaseong-si (KR)

(73) Assignee: GigaLane Co., Ltd., Hwaseong-si (KR)

( * ) Notice: Subject to any disclaimer, the term of this patent is extended or adjusted under 35 U.S.C. 154(b) by 239 days.

(21) Appl. No.: 17/274,463

(22) PCT Filed: Oct. 16, 2019

(86) PCT No.: PCT/KR2019/013555
§ 371 (c)(1),
(2) Date: Mar. 9, 2021

(87) PCT Pub. No.: WO2020/105865
PCT Pub. Date: May 28, 2020

(65) Prior Publication Data

US 2022/0013966 A1 Jan. 13, 2022

(30) Foreign Application Priority Data

Nov. 23, 2018 (KR) ........................ 10-2018-0146095

(51) Int. Cl.
*H01R 24/50* (2011.01)
*H01R 24/40* (2011.01)
(Continued)

(52) U.S. Cl.
CPC ........... *H01R 24/40* (2013.01); *H01R 12/714* (2013.01); *H01R 13/2421* (2013.01); *H01R 13/652* (2013.01); *H01R 43/20* (2013.01)

(58) Field of Classification Search
CPC .............................. H01R 12/714; H01R 24/50
See application file for complete search history.

(56) References Cited

U.S. PATENT DOCUMENTS 4,397,519 A * 8/1983 Cooney .............. H01R 13/2421 324/755.05
5,928,000 A * 7/1999 Rudisill ................. H01R 24/52 439/700
(Continued)

FOREIGN PATENT DOCUMENTS

CN 201149919 Y 11/2008
CN 201294286 Y 8/2009
(Continued)

OTHER PUBLICATIONS

International Search Report from International Application No. PCT/KR2019/013555, dated Feb. 10, 2020.

*Primary Examiner* — Neil Abrams
(74) *Attorney, Agent, or Firm* — Shih IP Law Group PLLC.

(57) ABSTRACT

The disclosed invention relates to a method of manufacturing a housing-integrated board mating connector, the method including: preparing a housing of an electrical device, the housing having a housing insertion hole formed therein and a part or the entirety of the housing being made of a conductive metal material; inserting a cylindrical ground gasket into the housing insertion hole; preparing a dielectric part and signal terminal part assembly in which a dielectric part surrounds a signal terminal part; and inserting
(Continued)

the dielectric part and signal terminal part assembly into an inner circumferential surface of the ground gasket.

26 Claims, 8 Drawing Sheets

(51) Int. Cl.

| | |
|---|---|
| ***H01R 12/71*** | (2011.01) |
| ***H01R 13/24*** | (2006.01) |
| ***H01R 13/652*** | (2006.01) |
| ***H01R 43/20*** | (2006.01) |

(56) References Cited

U.S. PATENT DOCUMENTS

| | | | | |
|---|---|---|---|---|
| 6,231,352 | B1 * | 5/2001 | Gonzales | H01R 12/52 439/66 |
| 6,376,766 | B1 | 4/2002 | Bartholoma | |
| 6,623,279 | B2 * | 9/2003 | Derian | G06F 1/18 257/E23.09 |
| 7,118,383 | B2 * | 10/2006 | Nagata | H01R 24/50 439/63 |
| 7,210,225 | B2 * | 5/2007 | Olson | H05K 7/1069 29/882 |
| 8,827,730 | B2 * | 9/2014 | Ihara | H01R 12/714 439/206 |
| 8,944,827 | B2 * | 2/2015 | Ohsaka | H01R 12/57 439/63 |
| 9,590,345 | B2 * | 3/2017 | Wollitzer | H01R 13/2421 |
| 10,971,846 | B2 * | 4/2021 | So | H01R 12/716 |
| 11,239,616 | B2 * | 2/2022 | Park | H01R 24/50 |
| 11,349,235 | B2 * | 5/2022 | Jung | H01R 13/17 |
| 11,355,874 | B2 * | 6/2022 | Jung | H01R 24/50 |
| 11,355,881 | B2 * | 6/2022 | Wang | H01R 13/187 |
| 2005/0272278 | A1 | 12/2005 | Staniszewski | |
| 2009/0211806 | A1 | 8/2009 | Taylor | |
| 2022/0013966 | A1 * | 1/2022 | Song | H01R 13/652 |

FOREIGN PATENT DOCUMENTS

| | | | |
|---|---|---|---|
| CN | 108346876 | A | 7/2018 |
| EP | 2639884 | A1 | 9/2013 |
| EP | 3595093 | A3 | 4/2020 |
| JP | 64057579 | A | 3/1989 |
| JP | 05055481 | U | 7/1993 |
| JP | 2010097772 | A | 4/2010 |
| KR | 2019990015370 | U | 5/1999 |

* cited by examiner

HOUSING-INTEGRATED BOARD MATING CONNECTOR AND METHOD OF MANUFACTURING SAME

CROSS-REFERENCE TO RELATED APPLICATIONS

This Application is the National Stage filing under 35 U.S.C. § 371 of PCT Application Ser. No. PCT/KR2019/013555 filed on Oct. 16, 2019, which claims the benefit of Korean Patent Application No. 10-2018-0146095 filed on Nov. 23, 2018. The disclosures of both applications are hereby incorporated herein by reference in their entireties.

TECHNICAL FIELD

The present invention relates to a method or process of manufacturing a housing-integrated board mating connector by using an electric/electronic device itself provided with a board mating connector, such as a cavity filter, as a housing of a board mating connector.

BACKGROUND

Board mating connectors are formed between an upper board and a lower board such as printed circuit boards, on which signal lines are formed, to transfer radio frequency (RF) signals between the boards. The board mating connectors themselves are provided as completed electrical components, and the board mating connectors are fixed to one board among the upper board and the lower board or are mounted on another electric/electronic device, for example, a cavity filter, disposed in a circuit connection between the upper and lower boards to electrically connect the upper and lower boards.

The board mating connectors serve to transfer the RF signals between the boards and thus are widely used in transceivers for antenna signals. Multiple input multiple output (MIMO) technology using a plurality of antennas is used to increase data transmission capacity. As a current $4^{th}$ generation (4G) communication environment develops into a communication environment of $5^{th}$ generation (5G) or higher, the number of antennas increases exponentially, and accordingly, the demand for board mating connectors is also increasing to the same extent.

As the demand for board mating connectors increases, the cost burden is also important. Considering a rapidly developing future communication environment, it is necessary to devise a plan for reducing the cost of the board mating connector.

Further, in order to accommodate a larger number of board mating connectors within the same area as the communication environment of 5G or higher develops, it is required in the market to lower the contact height, which is a height between the upper and lower boards electrically connected by the board mating connector.

RELATED ART DOCUMENTS

Patent Documents (Patent Document 1) KR10-2015-0080486 A
(Patent Document 2) KR10-1326296 B1
(Patent Document 3) KR10-1326296 B1
(Patent Document 4) KR10-1855133 B1

Technical Problem

The present invention is directed to providing a method of manufacturing a housing-integrated board mating connector, which allows the manufacturing costs of the board mating connector to be reduced.

Technical Solution

One aspect of the present invention provides a method of manufacturing a housing-integrated board mating connector, the method including: preparing a housing of an electrical device, the housing having a housing insertion hole formed therein and a part or the entirety of the housing being made of a conductive metal material; inserting a cylindrical ground gasket into the housing insertion hole; preparing a dielectric part and signal terminal part assembly in which a dielectric part surrounds a signal terminal part; and inserting the dielectric part and signal terminal part assembly into an inner circumferential surface of the ground gasket.

The inserting of the cylindrical ground gasket into the housing insertion hole may include forming an insertion part slit between opposite ends of the rolled ground gasket to impart elasticity to the ground gasket.

In the inserting of the cylindrical ground gasket into the housing insertion hole, the ground gasket may include: a ground insertion part inserted into the housing insertion hole; a ground elastic part extending from the ground insertion part to an outside of the housing insertion hole and having three or more slits cut along a circumference thereof to have elasticity; and a ground contact part extending from the ground elastic part and being in contact with a ground electrode of a board.

The ground elastic part may include a first elastic portion extending outward from the ground insertion part and a second elastic portion extending inward from the first elastic portion, and the ground contact part may extend obliquely in a direction from the second elastic portion toward a center of the housing insertion hole.

A free end of the ground contact part may be bent inward to form a curved surface.

A fixed protrusion protruding inward may be provided in the ground insertion part, and an annular fixed groove to which the fixed protrusion is bound may be provided in a surface of the dielectric part.

The inserting of the dielectric part and signal terminal part assembly into the inner circumferential surface of the ground gasket may include press-fitting the dielectric part and signal terminal part assembly into the inner circumferential surface of the ground gasket.

The inserting of the dielectric part and signal terminal part assembly into the inner circumferential surface of the ground gasket may be performed using a jig that is in contact with and grips an upper surface of the dielectric part.

The jig may be in contact with the upper surface of the dielectric part to vacuum-adhere and grip the dielectric part and signal terminal part assembly through suctioning.

The jig may have a hole having a diameter corresponding to the signal terminal part exposed from the dielectric part to an upper side and the signal terminal part may be fitted into the hole and gripped.

A portion of the jig, in which the hole is at least formed, may be made of a material different from that of the signal terminal part to prevent damage to the signal terminal part that occurs in a forcible fitting process.

The portion of the jig, in which the hole is at least formed, may be made of an elastic resin material.

The formation of the housing insertion hole in the housing of the electrical device, the housing being made of a conductive metal material may include providing a stepped portion, of which a diameter is reduced in a direction in which the ground gasket and the dielectric part and signal terminal part assembly are inserted, in the housing insertion hole, and the inserting of the cylindrical ground gasket into the housing insertion hole and the inserting of the dielectric part and signal terminal part assembly into the inner circumferential surface of the ground gasket may include inserting the ground gasket and the dielectric part and signal terminal part assembly until the ground gasket and the dielectric part and signal terminal part assembly come into contact with the stepped portion.

In the preparing of the dielectric part and signal terminal part assembly in which the dielectric part surrounds the signal terminal part, the signal terminal part may include: a fixed terminal portion having one open side and a body insertion hole formed therein; a movable terminal portion having one open side and a contact insertion hole formed therein; and a signal spring inserted between the body insertion hole and the contact insertion hole, and the signal terminal part may be prepared so that a portion of the one open side of the movable terminal portion is inserted into the body insertion hole and the fixed terminal portion and the movable terminal portion are electrically connected by the signal spring.

A contact protrusion may protrude from an end of the one open side of the movable terminal portion, an annular guide groove having a predetermined length may be spaced apart from the contact protrusion, and three or more contact slits may be cut along a circumference of the movable terminal portion starting from the end of the one open side of the movable terminal portion to an end of the guide groove, a body protrusion having a height corresponding to a depth of the guide groove may formed on an inner circumferential surface of the fixed terminal portion, and the end of the one open side of the movable terminal portion having elasticity by the contact slit may be inserted into the body insertion hole of the fixed terminal portion, a jaw of the guide groove of the movable terminal portion may be caught by a jaw of the body protrusion of the fixed terminal portion, and thus separation of the movable terminal portion may be prevented.

The movable terminal portion may be elastically movable relative to the fixed terminal portion by elastic support of the signal spring within a range in which the jaw of the guide groove is in contact with the body protrusion of the fixed terminal portion.

The preparing of the dielectric part and signal terminal part assembly in which the dielectric part surrounds the signal terminal part may include coupling the fixed terminal portion to the dielectric part to form the dielectric part and signal terminal part assembly.

The inserting of the dielectric part and signal terminal part assembly into the inner circumferential surface of the ground gasket may include inserting the dielectric part and signal terminal part assembly into the inner circumferential surface of the ground gasket in a state in which the movable terminal portion is coupled to the fixed terminal portion, or after the dielectric part and signal terminal part assembly is inserted into the inner circumferential surface of the ground gasket in a state in which the fixed terminal portion is coupled to the dielectric part, sequentially coupling the signal spring and the movable terminal portion to completely form the dielectric part and signal terminal part assembly.

The coupling of the fixed terminal portion to the dielectric part may include integrally coupling the fixed terminal portion to the dielectric part through insert injection molding or pressing-fitting the fixed terminal portion to the dielectric part in a forcible-fitting manner.

The formation of the housing insertion hole in the housing of the electrical device, the housing being made of a conductive metal material may include forming a ground metal layer through plating on at least an inner circumferential surface of the housing insertion hole so that a ground connection between the ground gasket and the housing insertion hole is smoothly made.

Another aspect of the present invention provides a signal terminal part including: a fixed terminal portion having one open side and having a body insertion hole formed therein; a movable terminal portion having one open side and having a contact insertion hole formed therein; and a signal spring inserted between the body insertion hole and the contact insertion hole, wherein a portion of the one open side of the movable terminal portion may be inserted into the body insertion hole, the movable terminal portion may include: a contact protrusion protruding from an end of the one open side of the movable terminal portion; an annular guide groove having a predetermined length and spaced apart from the contact protrusion; and three or more contact slits cut along a circumference of the movable terminal portion starting from the end of the one open side to an end of the guide groove, wherein the fixed terminal portion includes a body protrusion formed on an inner circumferential surface thereof and having a height corresponding to a depth of the guide groove, and the contact protrusion is always in close contact with an inner circumferential surface of the body insertion hole, a jaw of the guide groove is caught by a jaw of the body protrusion, and thus separation of the movable terminal portion is prevented.

Still another aspect of the present invention provides a housing-integrated board mating connector including: a ground insertion part; a signal terminal part inserted into a center of the ground insertion part; a pair of first elastic parts extending outward from the ground insertion part and being symmetrical to each other in a left-right direction based on the signal terminal part; a pair of second elastic parts extending inward from the pair of first elastic parts and being symmetrical to each other in the left-right direction based on the signal terminal part; and a pair of ground contact parts extending obliquely inward from the pair of second elastic parts and being symmetrical to each other in the left-right direction based on the signal terminal part, wherein, when the pair of ground contact parts electrically come into contact with a ground electrode, as the pair of ground contact parts are gathered toward the signal terminal part, a separation distance between the pair of ground contact parts may become narrower.

A free end of each of the pair of ground contact parts may be bent inward to form a curved surface.

The housing-integrated board mating connector may further include: a fixed terminal portion having one open side and having a body insertion hole formed therein; a movable terminal portion having one open side and having a contact insertion hole formed therein; and a signal spring inserted between the body insertion hole and the contact insertion hole, wherein a portion of the one open side of the movable terminal portion may be inserted into the body insertion hole, the movable terminal portion may include: three or more contact slits cut along a circumference of the movable terminal portion starting from an end of the one open side to an end of the guide groove; and a contact protrusion protruding from the end of the one open side of the movable terminal portion, and the contact protrusion may be always in close contact with an inner circumferential surface of the body insertion hole.

The movable terminal portion may include an annular guide groove spaced apart from the contact protrusion and having a predetermined length, the fixed terminal portion may include a body protrusion formed on an inner circumferential surface thereof to have a height corresponding to a depth of the guide groove, and a jaw of the guide groove may be caught by a jaw of the body protrusion, and thus separation of the movable terminal portion may be prevented.

Advantageous Effects

According to a method of manufacturing a housing-integrated board mating connector of the present invention, as a housing of an electrical device is shared as a housing of the board mating connector, manufacturing costs of the board mating connector can be lowered.

Further, the present invention has an advantage in that since the housing-integrated board mating connector is manufactured by inserting each component of the board mating connector into a housing insertion hole formed in the housing of the electrical device, a manufacturing process is very simple.

Further, as the housing-integrated board mating connector is manufactured by inserting each component of the board mating connector into the housing insertion hole formed in the housing of the electrical device, each component may be disassembled in a reverse process. Accordingly, it is possible to replace only some degraded or damaged components, and thus maintenance and repair costs can be reduced.

Further, in the related art, the board mating connector electrically connects an upper board and a lower board. However, one board (for example, a lower board) is replaced by the housing, a portion of the board mating connector is inserted into the housing insertion hole, and thus a contact height can be lowered.

MODE FOR CARRYING OUT THE INVENTION

Figure 1:
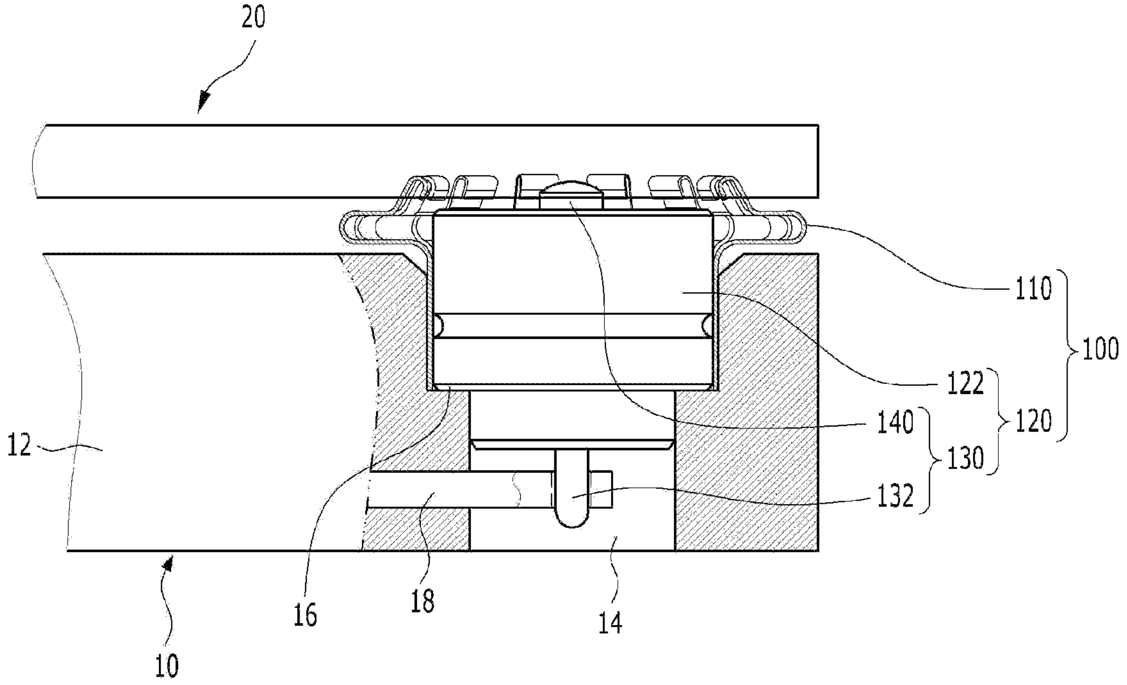
FIG. 1 is a cross-sectional view illustrating a structure in which a board mating connector is integrally formed in a housing of an electric/electronic device according to the present invention.

Since various modifications may be applied and various embodiments may be provided, the present invention is intended to illustrate specific embodiments and is described in detail in the detailed description. However, it should be understood that the present invention is not limited to the specific embodiments and includes all modifications, equivalents, and substitutes included in the spirit and scope of the present invention.

Terms used in the present invention are used only to describe the specific embodiments and are not intended to limit the present invention. Singular expressions include plural expressions unless clearly otherwise indicated in the context. It should be understood that terms such as "include" or "have" used herein are intended to indicate that there are features, numbers, steps, operations, components, parts, or combinations thereof that are described in the specification and do not exclude in advance the possibility of the presence or addition of one or more other features, numbers, steps, operations, components, parts, or combinations thereof.

Hereinafter, exemplary embodiments of the present invention will be described in detail with reference to the accompanying drawings. In this case, it should be noted that in the accompanying drawings, the same components are indicated by the same reference numerals as much as possible. Further, detailed description of well-known functions and configurations, which may make the subject matter of the present invention unclear, will be omitted. For the same reason, in the accompanying drawings, some components are exaggerated, omitted, or schematically illustrated.

Figure 6:
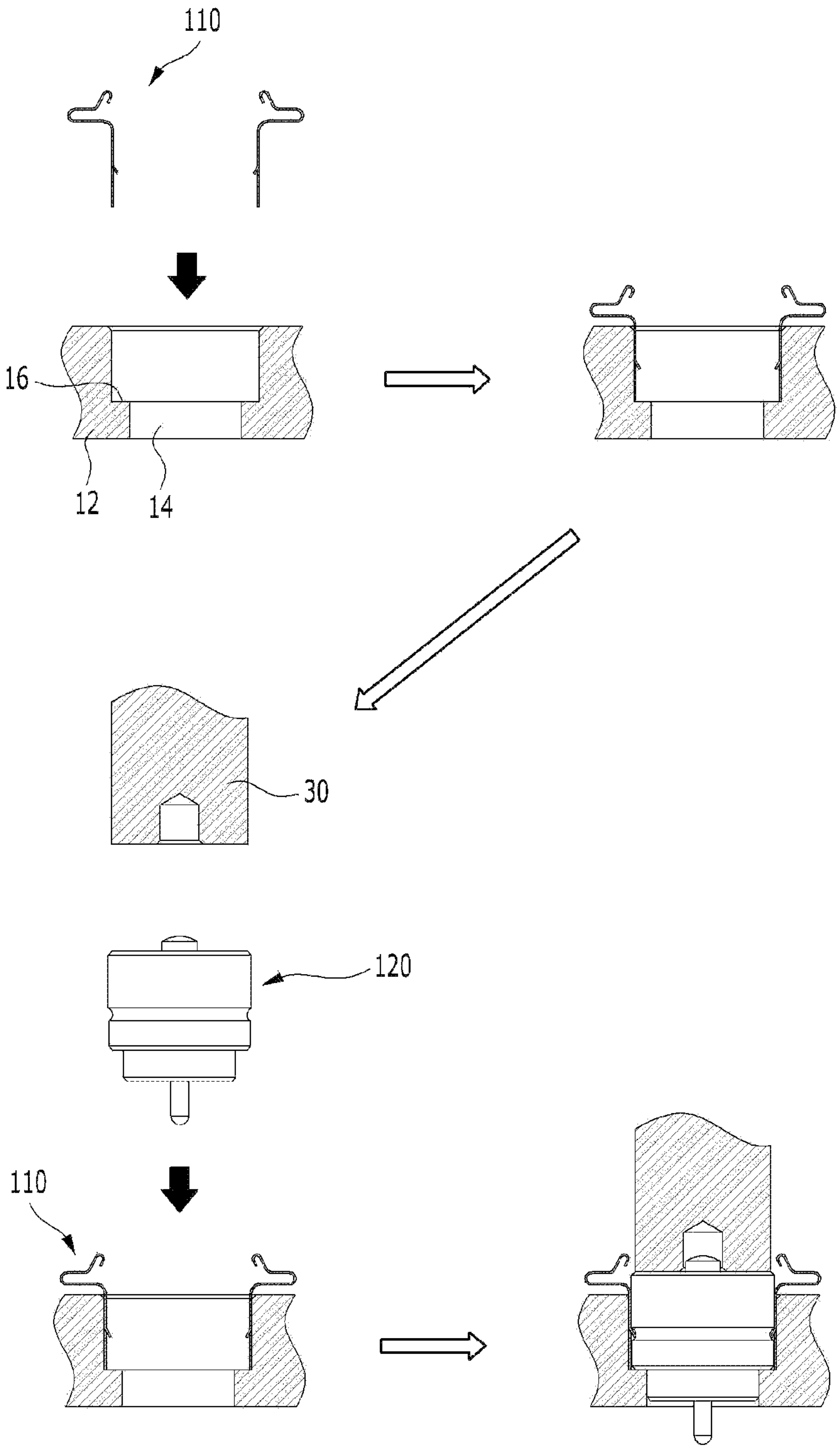
FIG. 6 is a view illustrating a series of manufacturing processes of a housing-integrated board mating connector according to the present invention.

FIG. 1 is a cross-sectional view illustrating a structure in which a board mating connector 100 is integrally formed in a housing 12 of an electric/electronic device according to the present invention, and FIG. 6 is a view illustrating a series of manufacturing processes of the housing-integrated board mating connector 100 according to the present invention. After describing a basic manufacturing method of the present invention with reference to the accompanying drawings, a configuration of a ground gasket 110, a dielectric part and signal terminal part assembly 120 constituting the board mating connector 100 will be described in detail.

The present invention relates to a method of manufacturing a housing-integrated board mating connector 100, wherein the housing-integrated board mating connector 100 is completed through a process of inserting each component constituting the board mating connector 100 into a housing insertion hole 14 provided in the housing 12 of an electric/electronic device 10 (hereinafter, briefly referred to as an "electrical device" throughout the detailed description and the appended claims). FIG. 6 schematically illustrates a series of processes for manufacturing the housing-integrated board mating connector 100.

First, the housing 12 of the electrical device 10 in which the housing insertion hole 14 is formed is prepared. The electrical device 10 includes various electrical devices 10 to which the board mating connector 100 is coupled. For example, a cavity filter provided in an antenna signal transceiver corresponds to the electrical device 10. By providing the housing insertion hole 14 in the housing 12 of the electrical device 10, the housing 12 is replaced with the housing of the board mating connector 100.

A part or the entirety of the housing 12 is made of a metal (for example, aluminum or stainless steel) so that the housing 12 may be grounded to the ground of the electrical device 10 or may itself function as the ground. Further, a ground metal layer 17 may be formed through plating on at least the inner circumferential surface of the housing insertion hole 14 so that a ground connection with the board mating connector 100 is smoothly formed (see FIG. 7).

When the electrical device 10 is the cavity filter (waveguide filter), the housing 12 may be formed integrally with a resonance part of the cavity filter, and the housing 12 may be formed by plating a dielectric with a metal or may be formed of only a metal depending on the type of cavity filter.

Next, the cylindrical ground gasket 110 is inserted into the housing insertion hole 14 provided in the housing 12 of the electrical device 10. The ground gasket 110 is manufactured by performing a plastic working process on a metal plate made of a conductive material. A detailed configuration of the ground gasket 110 will be described in detail with reference to FIGS. 2 and 3 in a corresponding part. The ground gasket 110 may be in contact with a wall surface of the housing insertion hole 14 to serve as an intermediary for electrically connecting the housing 12 and a ground electrode (not illustrated) of another board 20, and particularly, may be in elastic contact with the ground electrode of another board 20 to always maintain an electrode contact state at a certain level or more. Since the ground gasket 110 is made of a thin metal plate, thus is easily deformed, and does not require a large force for insertion, the ground gasket 110 may be manually inserted into the housing insertion hole 14.

Opposite ends of the rolled ground gasket 110 are not attached to each other and spaced apart from each other by a predetermined interval. Accordingly, when the ground gasket 110 is inserted into the housing insertion hole 14, the ground gasket 110 comes into close contact with an insertion part slit 112-1, an outer diameter of the insertion part slit 112-1 becomes smaller than an inner diameter of the housing insertion hole 14, and thus the ground gasket 110 is smoothly inserted into the housing insertion hole 14. After the ground gasket is inserted into the housing insertion hole 14, the insertion part slit 112-1 is widened, and thus the ground gasket 110 is prevented from being separated from the housing insertion hole 14. That is, the insertion part slit 112-1 formed between the opposite ends of the rolled ground gasket 110 serves to provide elasticity to facilitate an insertion process of the ground gasket 110 into the housing insertion hole 14.

When the ground gasket 110 is inserted into the housing insertion hole 14, the prepared dielectric part and signal terminal part assembly 120 is inserted into the inner circumferential surface of the ground gasket 110. The dielectric part and signal terminal part assembly 120 is an assembly in which a dielectric part 122 and a signal terminal part 130 are combined into one component and has a structure in which the dielectric part 122 surrounds the signal terminal part 130. Thus, the dielectric part 122 is disposed between the ground gasket 110 and the signal terminal part 130 to electrically insulate the ground gasket 110 from the signal terminal part 130.

Insertion of the dielectric part and signal terminal part assembly 120 with respect to the ground gasket 110 inserted into the housing insertion hole 14 is made with a tolerance of a kind of forcible fitting. When the dielectric part and signal terminal part assembly 120 is assembled, a certain surface pressure or higher is formed between the housing insertion hole 14, the ground gasket 110, and the dielectric part and signal terminal part assembly 120. Thus, the ground gasket 110 and the dielectric part and signal terminal part assembly 120 are fixed into and not easily separated from the housing insertion hole 14. Thus, unlike the insertion and fixing of the ground gasket 110, a considerable pressure is required to insert the dielectric part and signal terminal part assembly 120. Thus, it may be necessary to press-fit the dielectric part and signal terminal part assembly 120 using a jig 30.

The jig 30 may be in contact with the upper surface of the dielectric part 122 and vacuum-adheres and grips the dielectric part and signal terminal part assembly 120 through suctioning. Alternatively, the jig 30 may have a hole 31 having a diameter that is smaller than or equal to that of the signal terminal part 130 exposed from the dielectric part 122 to the upper side and thus may press-fit the dielectric part and signal terminal part assembly 120 into the ground gasket 110 in a state in which the signal terminal part 130 is fitted in the hole 31 and is gripped.

Figure 8A:
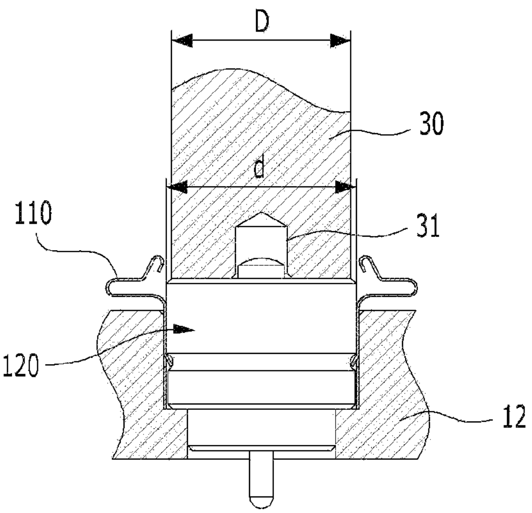
FIG. 8A is a view illustrating a diameter relationship between the ground gasket and a jig.

Here, as illustrated in FIG. 8A, since the jig 30 gripping the dielectric part and signal terminal part assembly 120 should enter the ground gasket 110, it is necessary that an outer diameter D of the jig 30 is smaller than or at least equal to the diameter d of a ground contact part 118 of the ground gasket 110.

When the hole 31 is formed in the jig 30, a portion of the jig 30, in which the hole 31 is at least formed, is formed of a material different from that of the signal terminal part 130, and thus damage to the signal terminal part 130 that may occur during a forcible fitting process may be prevented. In this case, it is preferable that the portion of the jig 30, in which the hole 31 is at least formed, is made of a resin material, particularly, a resin material having high elasticity, so that the signal terminal part 130 is smoothly fitted.

Further, in a state in which the portion of the jig 30, in which the hole 31 is formed, is formed of a magnet and the signal terminal part 130 is gripped by a magnetic force, the dielectric part and signal terminal part assembly 120 may be press-fitted to the ground gasket 110.

As described above, according to the method of manufacturing a housing-integrated board mating connector 100, as the housing 12 of the electrical device 10 is shared as the housing of the board mating connector 100, manufacturing costs of the board mating connector 100 may be reduced. In particular, when the demand for the board mating connector 100 significantly increases with the development of a communication environment, such a reduction in manufacturing costs leads to a large profit.

Further, in the present invention, since the housing-integrated board mating connector 100 is manufactured in a manner of inserting each component of the board mating connector 100 into the housing insertion hole 14 formed in the housing 12 of the electrical device 10, the manufacturing process becomes very simple. Further, as the housing-integrated board mating connector 100 is manufactured in a manner of inserting each component of the board mating connector 100 into the housing insertion hole 14 formed in the housing 12 of the electrical device 10, each component may be disassembled in a reverse process, it is possible to replace only some of degraded or damaged components, and thus maintenance and repair costs may be also reduced.

Further, in the related art, the board mating connector 100 electrically connects an upper board and a lower board. However, in the present invention, one board (for example, a lower board) is replaced by the housing 12, a portion of the board mating connector 100 is inserted into the housing insertion hole 14, and thus a contact height may be lowered.

Meanwhile, as illustrated in FIG. 1, the housing insertion hole 14 may be provided with a stepped portion 16 whose diameter is reduced in a direction in which the ground gasket 110 and the dielectric part and signal terminal part assembly 120 are inserted. Accordingly, the ground gasket 110 and the dielectric part and signal terminal part assembly 120 may be inserted until the ground gasket 110 and the dielectric part and signal terminal part assembly 120 come into contact with the stepped portion 16 of the housing insertion hole 14. That is, by forming the stepped portion 16 at an appropriate point of the housing insertion hole 14, the position of the board mating connector 100, particularly, the position of the signal terminal part 130, may be matched to a design target. Further, as a dielectric stepped portion 126 corresponding to the stepped portion 16 of the housing insertion hole 14 is formed in the dielectric part 122, the size of the dielectric part 122 may be properly designed.

Figure 2:
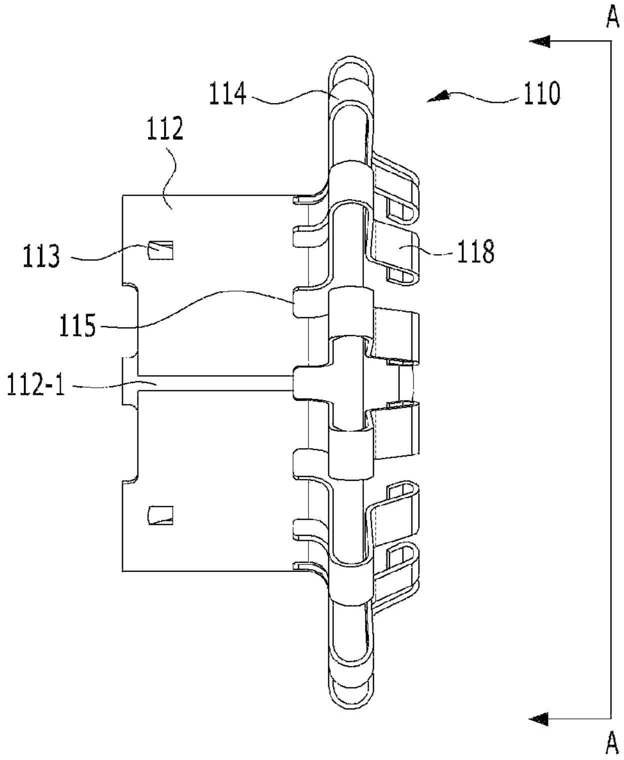
FIG. 2 is a side view of a ground gasket constituting the board mating connector.
Figure 3:
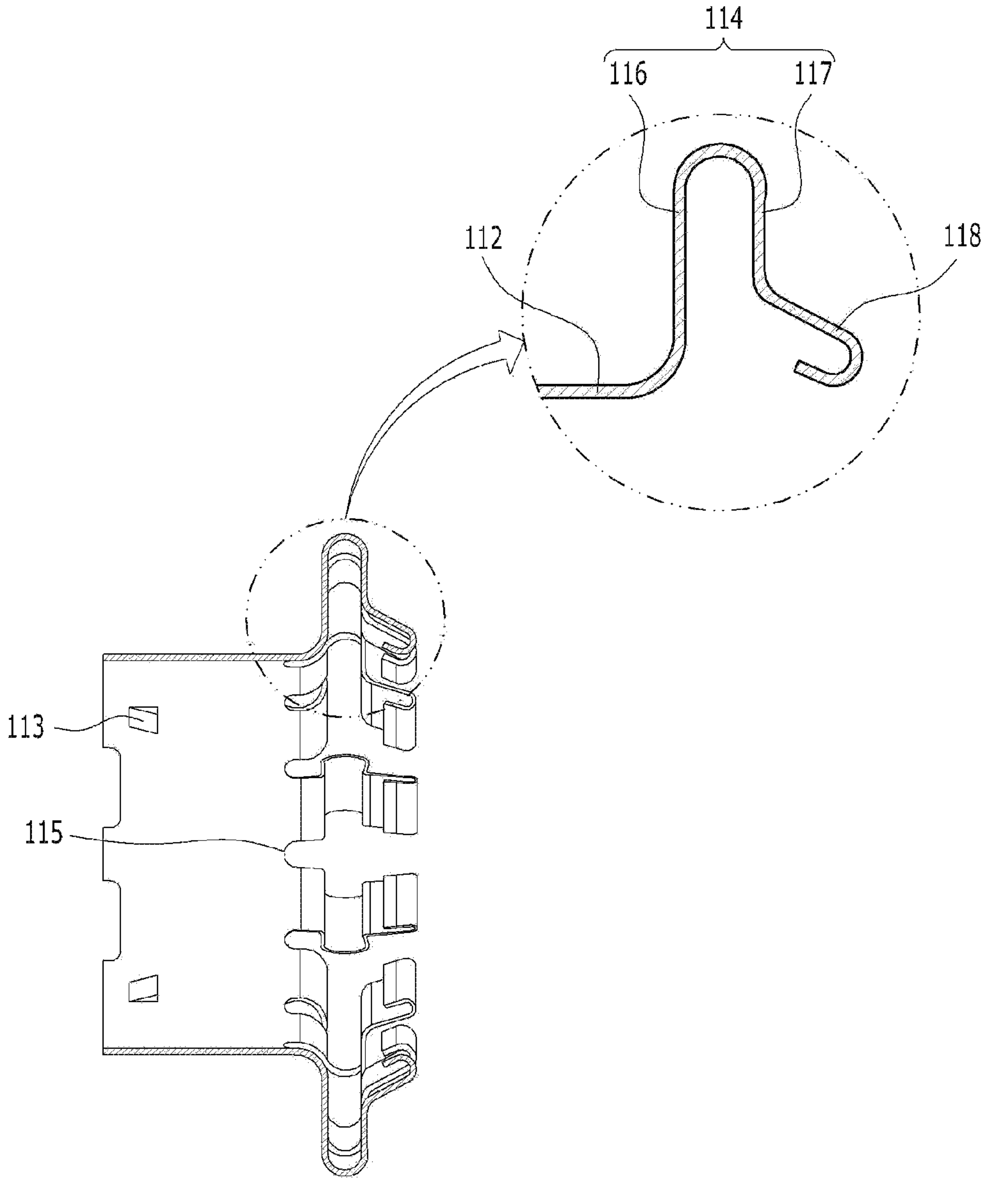
FIG. 3 is a cross-sectional view of the ground gasket taken along line "A-A" of FIG. 2.

FIG. 2 is a side view of a ground gasket 110 constituting the board mating connector 100, and FIG. 3 is a cross-sectional view of the ground gasket 110 taken along line "A-A" of FIG. 2. Referring to FIGS. 2 and 3, a configuration of the ground gasket 110 will be described in detail.

The ground gasket 110 roughly includes a ground insertion part 112, a ground elastic part 114, and a ground contact part 118 based on a function or role thereof.

The ground insertion part 112 is a cylindrical part inserted into the housing insertion hole 14. The ground gasket 110 is made by performing a plastic working process on a metal plate, and opposite ends of the rolled ground insertion part 112 are not attached to each other and spaced apart from each other by a predetermined interval, thereby imparting elasticity to the ground insertion part 112. The ground insertion part 112 serves as a support part for maintaining a fixed state with respect to the housing insertion hole 14 while being in close contact with the dielectric part and signal terminal part assembly 120.

Here, the ground insertion part 112 has a fixing protrusion 113 protruding inward (referring to a direction toward the center of the housing insertion hole, and the term "outward" refers to a direction opposite thereto), and correspondingly, an annular fixing groove 124 to which the fixing protrusion 113 is bound may be provided in the surface of the dielectric part 122. By binding the fixing protrusion 113 and the fixing groove 124, the ground gasket 110 and the dielectric part and signal terminal part assembly 120 may be more firmly coupled like one body, and this coupling state is used as a guideline for identifying whether the signal terminal part assembly 120 is properly inserted into the ground gasket 110. The fixing protrusion 113 may be made by being bent after cutting a portion of the ground insertion part 112 in a "⊂" shape or may be made by pressing and protruding a portion of the ground insertion part 112 although not illustrated. The fixing groove 124 is rounded into an annular shape so that the insertion of the dielectric part and signal terminal part assembly 120 does not have directionality.

The ground elastic part 114 is a part cut to form three or more silts 115 along the circumference of the ground gasket 110. Each cut portion is bent to have an appropriate elastic force, and accordingly, the ground elastic part 114 serves as a spring for the ground contact part 118. The ground contact part 118 extends from the ground elastic part 114 and serves as a terminal in contact with the ground electrode of another board 20.

Referring to FIG. 3, one embodiment of the ground elastic part 114 is illustrated well. The ground elastic part 114 includes a first elastic portion 116 extending outward from the ground insertion part 112, and a second elastic portion 117 extending inward from the first elastic portion 116, and the ground contact part 118 may extend obliquely in a direction from the second elastic portion 117 toward the center of the housing insertion hole 14, that is, in an inward direction.

Figure 8B:
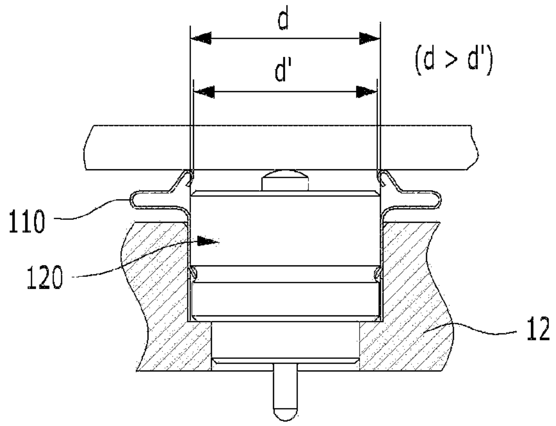
FIG. 8B is a view illustrating a state in which the diameter of the ground gasket is reduced when another board presses the ground gasket.

Here, the fact that the ground contact part 118 extends obliquely in the inward direction from the second elastic portion 117 toward the center of the housing insertion hole 14 is considered to improve noise shielding performance Referring to FIG. 8B, when the board 20 presses the ground contact part 118 of the board mating connector 100, the slope of a bent portion between the second elastic portion 117 and the ground contact part 118 becomes gentle. Accordingly, the ground contact parts 118 are gathered in the central direction (inside) of the housing insertion hole 14 (the distance between the ground contact parts 118 facing each other is reduced from d to d'; see FIG. 8). Since the ground contact part 118 comes into electrical contact with the ground electrode surrounding the outside of the board 20 centered on a signal electrode, the distance between the signal electrode and the ground electrode of the board 20 may be made narrower as the ground contact part 118 is elastically gathered inward, the noise shielding performance can be improved that much more.

According to the above embodiment, from the ground insertion part 112 to the ground contact part 118, there is a total of three bent portions including a bent portion between the ground insertion part 112 and the first elastic portion 116, a "U"-shaped bent portion between the first elastic portion 116 and the second elastic portion 117, and a bent portion between the second elastic portion 117 and the ground contact part 118.

Thus, since a contact pressure (pressure applied by another coupled board) applied to the ground contact part 118 at an end is distributed over the three bent portions, plastic deformation or breakage of the ground elastic part 114 and the ground contact part 118 can be very effectively prevented. Further, the distribution of the contact pressure applied to the ground contact part 118 results in smooth movement of the ground gasket 110, and accordingly, a contact state between the ground electrode of another board 20 and the ground contact part 118 is fairly uniform, thereby achieving a good effect on current flow.

Further, a free end of the ground contact part 118 may be bent inward to form a curved surface. This is for preventing wear and damage of the ground electrode because when the free end of the ground contact part 118 forms an edge, the ground contact part 118 may abrade or damage the ground electrode of another board 20. Further, as a surface contact is made instead of an end contact, a contact area is increased, and thus electrical connection performance can be improved.

Further, since the ground contact part 118 naturally slides when coming into contact with the board 20 by the curved surface of the free end of the ground contact part 118, the gathering of the ground gasket 110 in the inward direction may be made more smooth.

Figure 4:
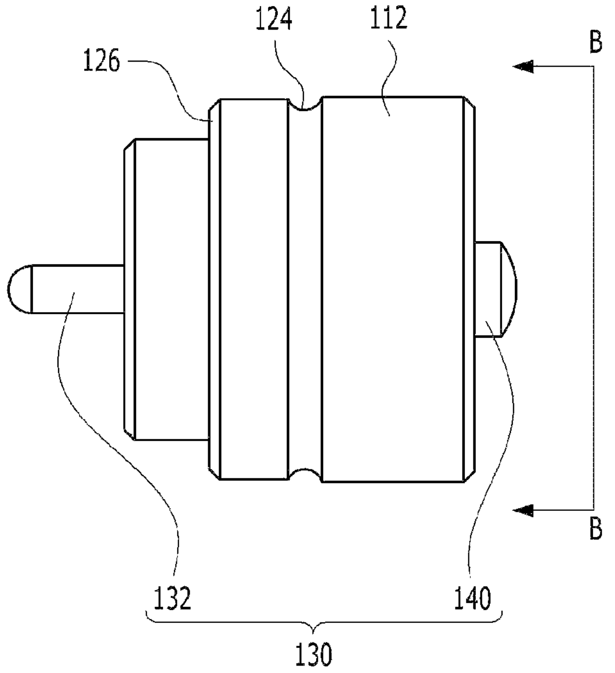
FIG. 4 is a side view illustrating a dielectric part and signal terminal part assembly constituting the board mating connector.
Figure 5:
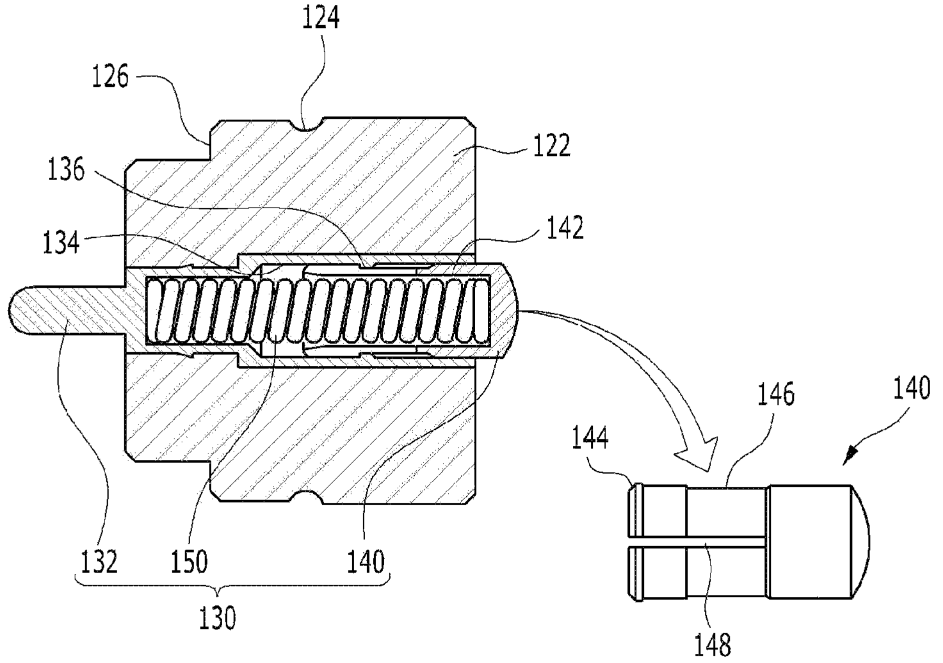
FIG. 5 is a cross-sectional view of the dielectric part and signal terminal part assembly taken along line "B-B" of FIG. 4.

Next, a configuration of the dielectric part and signal terminal part assembly 120 will be described in detail with reference to FIGS. 4 and 5. FIG. 4 is a side view illustrating a dielectric part and signal terminal part assembly 120 constituting the board mating connector 100, and FIG. 5 is a cross-sectional view of the dielectric part and signal terminal part assembly 120 taken along line "B-B" of FIG. 4.

The signal terminal part 130 includes a fixed terminal portion 132, a movable terminal portion 140, and a signal spring 150. The fixed terminal portion 132 is a terminal portion that is fixed to the dielectric part 122 and does not move, and the movable terminal portion 140 is a terminal portion that may be expanded and contracted in a lengthwise direction with respect to the fixed terminal portion 132 by elastic support of the signal spring 150. A signal current input to the fixed terminal portion 132 flows to the movable terminal portion 140 being in direct contact with the fixed terminal portion 132 and being in indirect contact with the fixed terminal portion 132 through the signal spring 150.

The fixed terminal portion 132 has a body insertion hole 134 formed therein and having one open side, and the movable terminal portion 140 has a contact insertion hole 142 formed therein and having one open side. The signal spring 150 is inserted between the body insertion hole 134 and the contact insertion hole 142 to elastically support the movable terminal portion 140 with respect to the fixed terminal portion 132, and the fixed terminal portion 132 and the movable terminal portion 140 are electrically connected by the signal spring 150.

Here, the signal terminal part 130 included in the present invention has a configuration in which the assembly of the movable terminal portion 140 to the fixed terminal portion 132 is simplified, separation between the movable terminal portion 140 and the fixed terminal portion 132 is prevented, a smooth expansion and contraction movement of the movable terminal portion 140 is induced, and reliable contact with the fixed terminal portion 132 is achieved. This will be described with reference to FIG. 5.

As illustrated in FIG. 5, the movable terminal portion 140 has a contact protrusion 144, which protrudes from an end of the one open side thereof, and an annular guide groove 146 which is spaced apart from the contact protrusion 144, has a predetermined length, and is formed in the surface thereof. Further, three or more contact slits 148 are cut along the circumference of the movable terminal portion 140 starting from the end of the one open side of the movable terminal portion 140 to an end of the guide groove 146, and thus the end of the one open side of the movable terminal portion 140 may be elastically deformed in a radial direction. Further, correspondingly, a body protrusion 136 having a height corresponding to the depth of the guide groove 146 is formed on the inner circumference of the fixed terminal portion 132.

As the signal terminal part 130 is configured as above, when the end of the one open side of the movable terminal portion 140 having elasticity by the contact slit 148 is inserted into the body insertion hole 134 of the fixed terminal portion 132, the one open side of the movable terminal portion 140 is contracted, and thus insertion is possible. When the movable terminal portion 140 is continuously inserted, the contact protrusion 144 of the movable terminal portion 140 passes over the body protrusion 136 on the inner circumferential surface of the fixed terminal portion 132, and then, a jaw of the guide groove 146 of the movable terminal portion 140 is caught by a jaw of the body protrusion 136 of the fixed terminal portion 132. In this state, since the jaw of the guide groove 146 of the movable terminal portion 140 and the jaw of the body protrusion 136 of the fixed terminal portion 132 are caught by each other, even when a force for expanding the compressed signal spring 150 is applied, the inserted movable terminal portion 140 is not separated.

Further, an outer diameter of the contact protrusion 144 of the movable terminal portion 140 is slightly larger than an inner diameter of the body insertion hole 134 of the fixed terminal portion 132. Accordingly, a force that always comes into close contact with the inner circumferential surface of the body insertion hole 134 is applied to the contact protrusion 144, and thus uniform contact is made. This is for preventing a problem in that the movable terminal portion 140 is shaken as the surfaces of the fixed terminal portion 132 and the movable terminal portion 140 performing an expansion and contraction movement with respect to the fixed terminal portion 132 are separated from each other.

Further, when the fixed terminal portion 132 and the movable terminal portion 140 are electrically connected depending on the signal spring 150, there is a problem in that passive intermodulation (PIM) increases due to a nonlinear shape of the signal spring. However, as the contact protrusion 144 is configured so that the end of the one open side of the movable terminal portion 140 may be elastically deformed in the radial direction by the contact slit 148, the fixed terminal portion 132 and the movable terminal portion 140 are electrically connected in a state in which the contact protrusion 144 is always in close contact with the inner circumferential surface of the body insertion hole 134, and thus PIM can be lowered.

When a force of a lengthwise component is applied to the movable terminal portion 140 while the jaw of the guide groove 146 of the movable terminal portion 140 and the jaw of the body protrusion 136 of the fixed terminal portion 132 are caught by each other, the movable terminal portion 140 may be elastically moved relative to the fixed terminal portion 132 by the elastic support of the signal spring 150 within a range in which the jaw of the guide groove 146 is in contact with the body protrusion 136 of the fixed terminal portion 132. That is, the expansion and contraction movement of the movable terminal portion 140 is smoothly induced by the contact between the guide groove 146 of the movable terminal portion 140 and the body protrusion 136 of the fixed terminal portion 132.

Further, since the signal terminal part 130 has a structure in which the movable terminal portion 140 is expanded and contracted with respect to the fixed terminal portion 132, the dielectric part and signal terminal part assembly 120 has a structure in which the fixed terminal portion 132 is coupled to the dielectric part 122 to form the assembly 120. According to an embodiment of the present invention, the coupling of the fixed terminal portion 132 to the dielectric part 122 is made by integrally coupling the fixed terminal portion 132 to the dielectric part 122 through insert injection molding or by integrally press-fitting the fixed terminal portion 132 to the dielectric part 122 in a forcible fitting manner. The forcible fitting manner is suitable when the material of the dielectric part 122 is not suitable for insert injection molding, for example, a Teflon material.

Here, in terms of the method of manufacturing the housing-integrated board mating connector 100, a time point at which the dielectric part and signal terminal part assembly 120 is completed may be appropriately selected according to a manufacturing process. That is, it is apparent that the completed dielectric part and signal terminal part assembly 120 in which the movable terminal portion 140 (including the signal spring) is coupled to the fixed terminal portion 132 is inserted into the inner circumferential surface of the ground gasket 110. Further, after the dielectric part and signal terminal part assembly 120 is inserted into the inner circumferential surface of the ground gasket 110 in a state in which the fixed terminal portion 132 is coupled to the dielectric part 122, the signal spring 150 and the movable terminal portion 140 are coupled, and then the dielectric part and signal terminal part assembly 120 may be completed. Thus, the meaning of the step of inserting the dielectric part and signal terminal part assembly 120 into the inner circumferential surface of the ground gasket 110 is not limited to inserting only the completed dielectric part and signal terminal part assembly 120.

Figure 7:
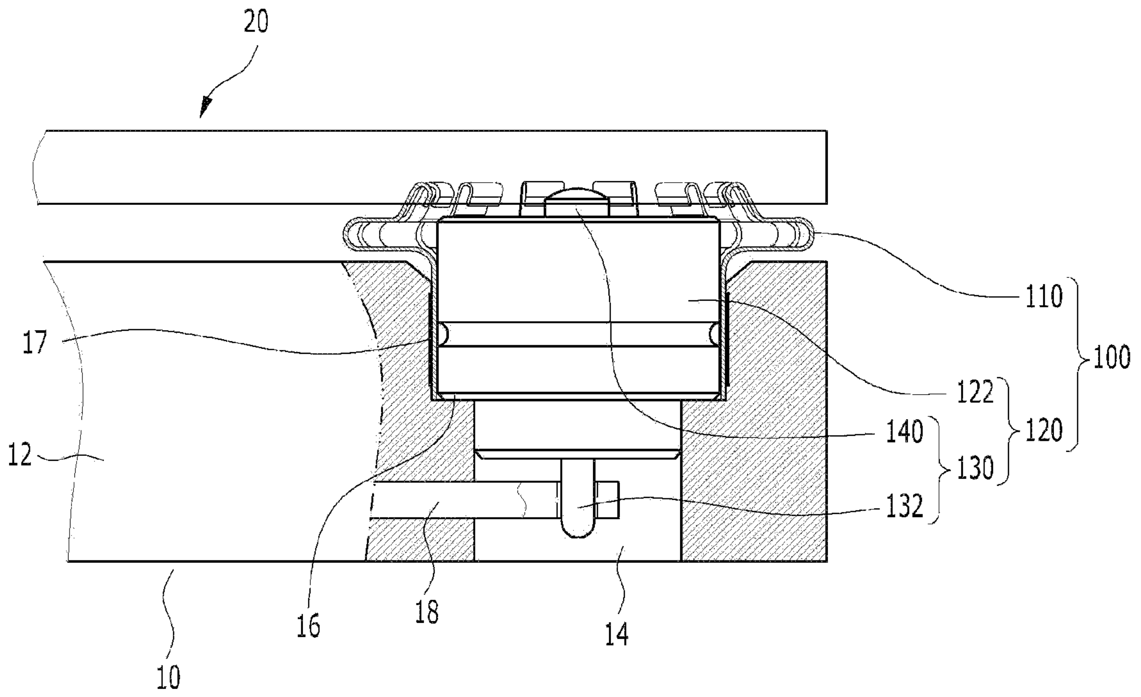
FIG. 7 is a cross-sectional view illustrating another structure in which a board mating connector is integrally formed in a housing of an electric/electronic device according to the present invention.

The board mating connector 100 integrated into one component by being assembled in the housing 12 of the electrical device 10 in an insertion manner should be electrically connected to the electrical device 10. This electrical connection requires two connections including a ground connection and a signal connection, and in particular, the present invention is advantageous in that the ground connection may be simplified. When describing this, since the housing 12 itself replaces the ground electrode, the ground electrode of the electrical device 10 and the ground gasket 110 are automatically and electrically connected by an assembly process of inserting the ground gasket 110 into the housing insertion hole 14 and press-fitting the dielectric part and signal terminal part assembly 120. Furthermore, as illustrated in FIG. 7, the ground metal layer 17 may be formed through plating on at least the inner circumferential surface of the housing insertion hole 14 so that the ground connection between the board mating connector 100 and the housing insertion hole 14 is smoothly made.

Further, a signal electrode 18 of the electrical device 10 is electrically connected to the fixed terminal portion 132 exposed in the housing insertion hole 14. In this case, it is preferable that the fixed terminal portion 132 does not protrude out of the housing insertion hole 14 so that deformation and damage of the fixed terminal portion 132 is prevented, and the height of the housing-integrated board mating connector 100 is lowered as much as possible.

Hereinabove, the embodiments of the present invention have been described. However, those skilled in the art can variously modify and change the present invention by adding, changing, and deleting components without departing from the spirit of the present invention, and these modifications and changes are also included in the scope of the present invention.

| [DESCRIPTION OF REFERENCE NUMERALS] | |
|---|---|
| 10: electrical device | 12: housing |
| 14: housing insertion hole | 16: stepped portion |
| 17: ground metal layer | 18: signal electrode |
| 20: board | 30: jig |
| 100: board mating connector | 110: ground gasket |
| 112: ground insertion part | 112-1: insertion part slit |
| 113: fixed protrusion | 114: ground elastic part |
| 115: slit | 116: first elastic part |
| 117: second elastic part | 118: ground contact part |
| 120: dielectric part and signal terminal part assembly | |
| 122: dielectric part | 124: fixed groove |
| 126: dielectric stepped portion | 130: signal terminal part |
| 132: fixed terminal portion | 134: body insertion hole |
| 136: body protrusion | 140: movable terminal portion |
| 142: contact insertion hole | 144: contact protrusion |
| 146: guide groove | 148: contact slit |
| 150: signal spring | |

The invention claimed is:

1. A method of manufacturing a housing-integrated board mating connector, the method comprising:

preparing a housing of an electrical device, the housing having a housing insertion hole formed therein and a part or the entirety of the housing being made of a conductive metal material;

inserting a cylindrical ground gasket into the housing insertion hole;

preparing a dielectric part and signal terminal part assembly in which a dielectric part surrounds a signal terminal part; and inserting the dielectric part and signal terminal part assembly into an inner circumferential surface of the ground gasket.

2. The method of claim 1, wherein the inserting of the cylindrical ground gasket into the housing insertion hole includes forming an insertion part slit between opposite ends of the rolled ground gasket to impart elasticity to the ground gasket.

3. The method of claim 1, wherein in the inserting of the cylindrical ground gasket into the housing insertion hole, the ground gasket includes:

a ground insertion part inserted into the housing insertion hole;

a ground elastic part extending from the ground insertion part to an outside of the housing insertion hole and having three or more slits cut along a circumference thereof to have elasticity; and a ground contact part extending from the ground elastic part and being in contact with a ground electrode of a board.

4. The method of claim 3, wherein the ground elastic part includes a first elastic portion extending outward from the ground insertion part and a second elastic portion extending inward from the first elastic portion, and the ground contact part extends obliquely in a direction from the second elastic portion toward a center of the housing insertion hole.

5. The method of claim 3, wherein a free end of the ground contact part is bent inward to form a curved surface.

6. The method of claim 3, wherein a fixed protrusion protruding inward is provided in the ground insertion part, and an annular fixed groove to which the fixed protrusion is bound is provided in a surface of the dielectric part.

7. The method of claim 1, wherein the inserting of the dielectric part and signal terminal part assembly into the inner circumferential surface of the ground gasket includes press-fitting the dielectric part and signal terminal part assembly into the inner circumferential surface of the ground gasket.

8. The method of claim 7, wherein the inserting of the dielectric part and signal terminal part assembly into the inner circumferential surface of the ground gasket is performed using a jig that is in contact with and grips an upper surface of the dielectric part.

9. The method of claim 8, wherein the jig is in contact with the upper surface of the dielectric part to vacuum-adhere and grip the dielectric part and signal terminal part assembly through suctioning.

10. The method of claim 8, wherein the jig has a hole having a diameter corresponding to the signal terminal part exposed from the dielectric part to an upper side, and the signal terminal part is fitted into the hole and gripped.

11. The method of claim 10, wherein a portion of the jig, in which the hole is at least formed, is made of a material different from that of the signal terminal part to prevent damage to the signal terminal part that occurs in a forcible fitting process.

12. The method of claim 11, wherein the portion of the jig, in which the hole is at least formed, is made of an elastic resin material.

13. The method of claim 1, wherein the formation of the housing insertion hole in the housing of the electrical device, the housing being made of a conductive metal material includes providing a stepped portion, of which a diameter is reduced in a direction in which the ground gasket and the dielectric part and signal terminal part assembly are inserted, in the housing insertion hole, and the inserting of the cylindrical ground gasket into the housing insertion hole and the inserting of the dielectric part and signal terminal part assembly into the inner circumferential surface of the ground gasket include inserting the ground gasket and the dielectric part and signal terminal part assembly until the ground gasket and the dielectric part and signal terminal part assembly come into contact with the stepped portion.

14. The method of claim 1, wherein in the preparing of the dielectric part and signal terminal part assembly in which the dielectric part surrounds the signal terminal part, the signal terminal part includes:

a fixed terminal portion having one open side and a body insertion hole formed therein;

a movable terminal portion having one open side and a contact insertion hole formed therein; and a signal spring inserted between the body insertion hole and the contact insertion hole, and the signal terminal part is prepared so that a portion of the one open side of the movable terminal portion is inserted into the body insertion hole and the fixed terminal portion and the movable terminal portion are electrically connected by the signal spring.

15. The method of claim 14, wherein a contact protrusion protrudes from an end of the one open side of the movable terminal portion, an annular guide groove having a predetermined length is spaced apart from the contact protrusion, and three or more contact slits are cut along a circumference of the movable terminal portion starting from the end of the one open side of the movable terminal portion to an end of the annular guide groove, a body protrusion having a height corresponding to a depth of the annular guide groove is formed on an inner circumferential surface of the fixed terminal portion, and the end of the one open side of the movable terminal portion having elasticity by the contact slit is inserted into the body insertion hole of the fixed terminal portion, a jaw of the annular guide groove of the movable terminal portion is caught by a jaw of the body protrusion of the fixed terminal portion, and thus separation of the movable terminal portion is prevented.

16. The method of claim 15, wherein the movable terminal portion is elastically movable relative to the fixed terminal portion by elastic support of the signal spring within a range in which the jaw of the annular guide groove is in contact with the body protrusion of the fixed terminal portion.

17. The method of claim 14, wherein the preparing of the dielectric part and signal terminal part assembly in which the dielectric part surrounds the signal terminal part includes coupling the fixed terminal portion to the dielectric part to form the dielectric part and signal terminal part assembly.

18. The method of claim 17, wherein the inserting of the dielectric part and signal terminal part assembly into the inner circumferential surface of the ground gasket includes:

inserting the dielectric part and signal terminal part assembly into the inner circumferential surface of the ground gasket in a state in which the movable terminal portion is coupled to the fixed terminal portion; or after the dielectric part and signal terminal part assembly is inserted into the inner circumferential surface of the ground gasket in a state in which the fixed terminal portion is coupled to the dielectric part, sequentially coupling the signal spring and the movable terminal portion to completely form the dielectric part and signal terminal part assembly.

19. The method of claim 17, wherein the coupling of the fixed terminal portion to the dielectric part includes integrally coupling the fixed terminal portion to the dielectric part through insert injection molding or pressing-fitting the fixed terminal portion to the dielectric part in a forcible-fitting manner.

20. The method of claim 1, wherein the formation of the housing insertion hole in the housing of the electrical device, the housing being made of a conductive metal material includes forming a ground metal layer through plating on at least an inner circumferential surface of the housing insertion hole so that a ground connection between the ground gasket and the housing insertion hole is smoothly made.

21. A signal terminal part comprising:

a fixed terminal portion having one open side and having a body insertion hole formed therein;

a movable terminal portion having one open side and having a contact insertion hole formed therein; and a signal spring inserted between the body insertion hole and the contact insertion hole, wherein a portion of the one open side of the movable terminal portion is inserted into the body insertion hole, the movable terminal portion includes:

a contact protrusion protruding from an end of the one open side of the movable terminal portion;

an annular guide groove having a predetermined length and spaced apart from the contact protrusion; and three or more contact slits cut along a circumference of the movable terminal portion starting from the end of the one open side to an end of the annular guide groove, the fixed terminal portion includes a body protrusion formed on an inner circumferential surface thereof and having a height corresponding to a depth of the annular guide groove_, and the contact protrusion is always in close contact with an inner circumferential surface of the body insertion hole, a jaw of the annular guide groove is caught by a jaw of the body protrusion, and thus separation of the movable terminal portion is prevented.

22. A housing-integrated board mating connector comprising:

a ground insertion part;

a signal terminal part inserted into a center of the ground insertion part;

a pair of first elastic parts extending outward from the ground insertion part and being symmetrical to each other in a left-right direction based on the signal terminal part;

a pair of second elastic parts extending inward from the pair of first elastic parts and being symmetrical to each other in the left-right direction based on the signal terminal part; and a pair of ground contact parts extending obliquely inward from the pair of second elastic parts towards the center of the ground insertion part and being symmetrical to each other in the left-right direction based on the signal terminal part, wherein, when the pair of ground contact parts electrically come into contact with a ground electrode, as the pair of ground contact parts are gathered toward the signal terminal part, a separation distance between the pair of ground contact parts becomes narrower.

23. The housing-integrated board mating connector of claim 22, wherein a free end of each of the pair of ground contact parts is bent inward to form a curved surface.

24. The housing-integrated board mating connector of claim 22, further comprising:

a fixed terminal portion having one open side and having a body insertion hole formed therein;

a movable terminal portion having one open side and having a contact insertion hole formed therein; and a signal spring inserted between the body insertion hole and the contact insertion hole, wherein a portion of the one open side of the movable terminal portion is inserted into the body insertion hole, the movable terminal portion includes:

three or more contact slits cut along a circumference of the movable terminal portion starting from an end of the one open side to an end of an annular guide groove; and a contact protrusion protruding from the end of the one open side of the movable terminal portion, and the contact protrusion is always in close contact with an inner circumferential surface of the body insertion hole.

25. The housing-integrated board mating connector of claim 24, wherein the movable terminal portion includes the annular guide groove spaced apart from the contact protrusion and having a predetermined length, the fixed terminal portion includes a body protrusion formed on an inner circumferential surface thereof to have a height corresponding to a depth of the annular guide groove, and a jaw of the annular guide groove is caught by a jaw of the body protrusion, and thus separation of the movable terminal portion is prevented.

26. The signal terminal part of claim 21, wherein an outer diameter of the contact protrusion of the movable terminal portion is larger than an inner diameter of the body insertion hole of the fixed terminal portion.

* * * * *